(12) United States Patent
Chen (10) Patent No.: US 8,547,707 B2
(45) Date of Patent: Oct. 1, 2013

(54) SPLIT ELECTRICAL CONTACTS IN AN ELECTRONIC ASSEMBLY

(75) Inventor: Kong-Chen Chen, San Jose, CA (US)

(73) Assignee: Wintec Industries, Inc., Milpitas, CA (US)

( * ) Notice: Subject to any disclaimer, the term of this patent is extended or adjusted under 35 U.S.C. 154(b) by 0 days.

(21) Appl. No.: 13/551,520

(22) Filed: Jul. 17, 2012

(65) Prior Publication Data

US 2012/0281378 A1 Nov. 8, 2012

Related U.S. Application Data

(63) Continuation of application No. 12/854,030, filed on Aug. 10, 2010.

(60) Provisional application No. 61/244,861, filed on Sep. 22, 2009.

(51) Int. Cl.
*H05K 7/00* (2006.01)

(52) U.S. Cl.
USPC ........... 361/782; 361/777; 361/779; 257/690; 29/832

(58) Field of Classification Search
None
See application file for complete search history.

(56) References Cited

U.S. PATENT DOCUMENTS

| | | |
|---|---|---|
| 3,239,788 A | 3/1966 | Norman et al. |
| 3,818,279 A | 6/1974 | Seeger, Jr. et al. |
| 3,971,610 A | 7/1976 | Buchoff et al. |
| 3,982,320 A | 9/1976 | Buchoff et al. |
| 4,050,756 A | 9/1977 | Moore |
| 4,064,623 A | 12/1977 | Moore |
| 4,067,945 A | 1/1978 | DuRocher |
| 4,118,092 A | 10/1978 | Sado et al. |
| 4,306,925 A | 12/1981 | Lebow et al. |
| 4,648,006 A | 3/1987 | Rayburn |
| 4,916,523 A | 4/1990 | Sokolovsky et al. |
| 5,321,583 A | 6/1994 | McMahon |
| 5,361,300 A | 11/1994 | Caddock, Jr. |
| 5,536,568 A | 7/1996 | Teruo |

(Continued)

FOREIGN PATENT DOCUMENTS

| | | |
|---|---|---|
| CN | 1754285 A | 3/2006 |
| TW | 200428723 A | 12/2004 |

(Continued)

OTHER PUBLICATIONS

European Extended Search Report, European Patent Application No. 10182559.4, dated Dec. 22, 2010, 7 pages.

(Continued)

*Primary Examiner* — Boris Chervinsky
(74) *Attorney, Agent, or Firm* — Kilpatrick Townsend and Stockton LLP (57) ABSTRACT

An electronic device is disclosed for coupling to a target platform, which includes a multitude of pad contacts. The electronic device includes a substrate, a multitude of pad contacts on the substrate, and a multitude of contact regions in one of the of pad contacts on the substrate. Each of the multitude of pad contacts on the substrate electrically couples to a corresponding one of the multitude of pad contacts on the target platform when the substrate and the target platform are assembled. The multitude of contact regions corresponds to one of the multitude of pad contacts on the target platform when the substrate and the target platform are assembled.

18 Claims, 8 Drawing Sheets

(56) References Cited

U.S. PATENT DOCUMENTS

| | | | |
|---|---|---|---|
| 5,661,450 | A | 8/1997 | Davidson |
| 6,040,983 | A | 3/2000 | Baudouin et al. |
| 6,154,114 | A | 11/2000 | Takahashi |
| 6,165,866 | A | 12/2000 | Kobayashi |
| 6,218,925 | B1 | 4/2001 | Iwao |
| 6,246,084 | B1 | 6/2001 | Kim |
| 6,396,712 | B1 | 5/2002 | Kuijk |
| 6,418,029 | B1 | 7/2002 | McKee et al. |
| 6,445,593 | B1 | 9/2002 | Okuyama |
| 6,478,909 | B1 | 11/2002 | Tuttle |
| 6,574,114 | B1 | 6/2003 | Brindle et al. |
| 6,577,225 | B1 | 6/2003 | Poole |
| 6,646,540 | B1 | 11/2003 | Lussey |
| 6,669,490 | B1 | 12/2003 | DelPrete et al. |
| 6,675,462 | B1 | 1/2004 | Takahashi |
| 6,916,719 | B1 | 7/2005 | Knight et al. |
| 6,978,029 | B1 | 12/2005 | Ikeda |
| 7,030,481 | B2 * | 4/2006 | Chudzik et al. ............... 257/700 |
| 7,038,144 | B2 * | 5/2006 | Yasuda et al. ................. 174/260 |
| 7,057,471 | B2 | 6/2006 | Sakai |
| 7,084,501 | B2 | 8/2006 | Utsunomiya |
| 7,319,369 | B2 | 1/2008 | Kawanami |
| 7,766,667 | B2 | 8/2010 | Russell |
| 7,843,303 | B2 | 11/2010 | Lu et al. |
| 7,973,771 | B2 | 7/2011 | Geaghan |
| 8,254,142 | B2 | 8/2012 | Chen |
| 2003/0080820 | A1 | 5/2003 | Nozu et al. |
| 2004/0061219 | A1 | 4/2004 | Utsumi |
| 2005/0017344 | A1 | 1/2005 | Utsunomiya |
| 2005/0173796 | A1 | 8/2005 | Pflughaupt et al. |
| 2006/0022290 | A1 | 2/2006 | Chen et al. |
| 2006/0118931 | A1 | 6/2006 | Ho et al. |
| 2006/0162287 | A1 | 7/2006 | Hasegawa |
| 2006/0220740 | A1 | 10/2006 | Bessho et al. |
| 2007/0046390 | A1 | 3/2007 | Soda et al. |
| 2007/0085648 | A1 | 4/2007 | Lee et al. |
| 2007/0139294 | A1 | 6/2007 | Dunn et al. |
| 2007/0187844 | A1 | 8/2007 | Chen |
| 2007/0190687 | A1 | 8/2007 | Chen et al. |
| 2007/0249161 | A1 | 10/2007 | Nakaone |
| 2008/0122031 | A1 | 5/2008 | DeNatale et al. |
| 2008/0136580 | A1 | 6/2008 | Bang et al. |
| 2008/0224818 | A1 | 9/2008 | Tanimura et al. |
| 2009/0078449 | A1 | 3/2009 | Hasegawa |
| 2009/0156029 | A1 | 6/2009 | Russell |
| 2009/0160602 | A1 | 6/2009 | Tsukada |
| 2010/0013202 | A1 | 1/2010 | Maeda et al. |
| 2010/0141370 | A1 | 6/2010 | Lu et al. |
| 2011/0069463 | A1 | 3/2011 | Chen |
| 2011/0085311 | A1 | 4/2011 | Chen |

FOREIGN PATENT DOCUMENTS

| | | |
|---|---|---|
| TW | I301739 | 10/2008 |
| WO | 2007/106780 A2 | 9/2007 |
| WO | 2008/100940 A1 | 8/2008 |

OTHER PUBLICATIONS

International Preliminary Report on Patentability of PCT Application No. PCT/US2010/049683, dated Mar. 27, 2012, 8 pages.
First Office Action for Chinese Patent Application No. 201010290781.4, dated Nov. 8, 2011, 11 pages.
European Extended Search Report, European Patent Application No. 10178319.9, dated Dec. 23, 2010, 6 pages.
PCT International Search Report and Written Opinion, PCT Application No. PCT/US 10/49683, mailed Nov. 17, 2010, 12 pages.
First Office Action for Chinese Patent Application No. 201010250037.1, dated May 4, 2012, 11 pages.
Office Action for U.S. Appl. No. 12/631,649, mailed on Jun. 13, 2012, 11 pages.
Official Communication for European Patent Application No. 10178319.9, dated Oct. 23, 2012, 5 pages.
Office Action for U.S. Appl. No. 12/631,649 (Jan. 11, 2013).
Taiwan Intellectual Property Office office action for application 99123422 (Dec. 21, 2012).
Taiwan Intellectual Property Office office action for application 99131797 (Mar. 21, 2013).

* cited by examiner

SPLIT ELECTRICAL CONTACTS IN AN ELECTRONIC ASSEMBLY

RELATED APPLICATIONS

This application is a continuation of commonly assigned U.S. Non-Provisional patent application Ser. No. 12/854,030 entitled "Method of Using Conductive Elastomer for Electrical Contacts in an Assembly," filed Aug. 10, 2010, which claims priority, under 35 U.S.C. §119(e) from U.S. Provisional Patent Application No. 61/244,861 entitled "Method of Using Conductive Elastomer for Electrical Contacts for Assembly Use," filed on Sep. 22, 2009, the contents of all of which are incorporated herein by reference in their entirety.

FIELD OF THE INVENTION

This invention relates generally to the manufacture of electronic components, and more particularly to using a conductive elastomer to embed one or more passive components in an electronic device assembly.

BACKGROUND OF THE INVENTION

Conventional uses of electrically conductive elastomers in electronic devices rely on the high conductivity and elastic nature of conductive elastomers to implement interface contacts or interconnection. For example, conductive elastomers are used at interface contacts to make multi-contact connectors, as conductive interposer in array package, directly as discrete molded conductive plastic passive components, or as electrical interconnections and contacts of electronic devices.

SUMMARY OF THE INVENTION

The present invention generally relates to a method for assembling an electronic device. An electronic device or substrate comprising a plurality of contact regions is manufactured. Conductive elastomers having different resisitivities are coupled to contact pads. By choosing a set of noble configurations and/or structures for contact pads implemented by the conductive elastomers at an electronic device or substrate and at a target platform to which an electronic device or substrate is attached, the passive components used for operation of electronic device or substrate may be directly embedded at the contact pads, providing substantial advantages over using a highly conductive elastomer material simply as an interconnection or as an interface contact. Embedding structures at a contact pad using conductive elastomers with different resistivities allows substantial reduction of the area overhead occupied by passive components on a target platform, such as a printed circuit board (PCB), which are essential to complement the normal operation of an electronic device on a target platform. Additionally, embedding structures in a contact pad using conductive elastomers beneficially enables solderless assembly of electronic products while reducing manufacturing costs by reducing the mounting of passive components and the thermal reflow process. Thus, in contrast to conventional use of conductive elastomers for their high conductivity, the current invention uses conductive elastomers having different resistivities, including an insulating elastomer, as contact pad materials so that a discrete or a set of passive components are embedded at contact pad of an electronic device or package for solderless assembly of electronic components.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The Figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE INVENTION

Embodiments of the present invention are now described with reference to the Figures where like reference numbers indicate identical or functionally similar elements. Also in the Figures, the left most digits of each reference number correspond to the Figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" or "an embodiment" in various places in the specification are not necessarily all referring to the same embodiment.

Additionally, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

Figure 1:
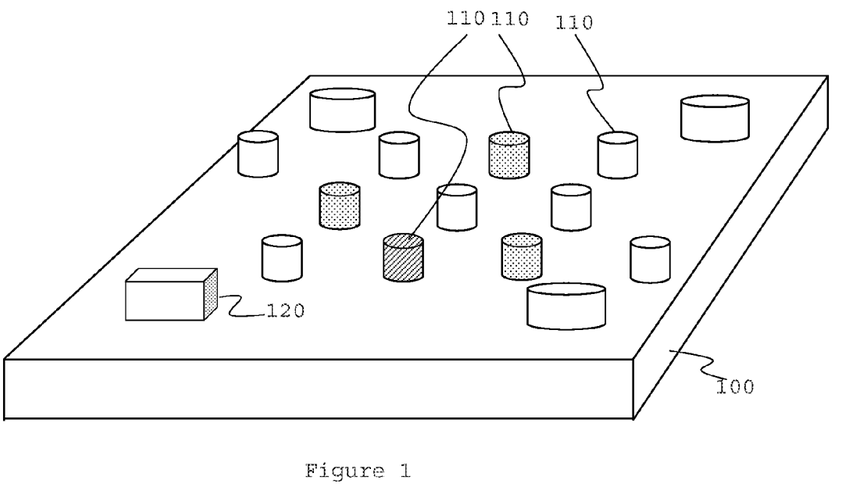
FIG. 1 is an example of a substrate including contact pads coupled to conductive elastomers according to an embodiment of the present invention.

FIG. 1 is an example of a substrate 100 including contact pads 110, 120 coupled to conductive elastomers. In various embodiments, the substrate 100 comprises an integrated circuit die, a stacked integrated circuit die, a packaged integrated circuit component, a component, a flex, a rigid flex, a printed circuit board (PCB) or similar entity. In various embodiments, the conductive elastomers have different resistances, configurations and/or geometries. For example, the contact pad 110, 120 may be a simple, uniform pad, or may be a pad having a structure including more than one elastomer material for implementing different functions such as an orientation indicator, a thermal dissipater, a mechanical support, a power connection, a ground connection, a passive component, a combination of passive components or other suitable function. Different conductive elastomers may have different conductivities, which range from less than $10^{-10}$ siemens/cm for an insulating material, to $10^{-5}$ siemens/cm for a semiconducting material and up to $10^5$ siemens/cm for a conducting material. The variation in conductivity allows different conductive elastomers to operate as an insulator, a semiconductor or a metal. In one embodiment, a contact pad 110, 120 is coupled to a conductive elastomer having a uniform conductivity. Different conductivities may be chosen for different contact pads. Alternatively, the contact pad 110, 120 is coupled to one or more conductive elastomers.

In one embodiment, a contact pad 110, 120 having a uniform zero ohm resistance elastomer is used as an interconnection pad. Alternatively, a contact pad 110, 120 having a uniform non-zero resistance is used as an interconnection pad coupled to a built-in resistor. Or, a contact pad 110, 120 having an insulating elastomer is used as an interconnect pad coupled to an embedded capacitor. Or more elastomers are used at an interconnection pad to embed a combination of a resistor and a capacitor at contact pad 110, 120.

In one embodiment, a conductive elastomer is coupled to a contact pad 110, 120 using in-situ lamination, deposition, evaporation, injection, bonding or any other suitable method. Additionally, the conductive elastomer has a geometry and/or size that varies depending in part on the functional requirements of a particular application. Coupling the contact pad 110, 120 to one or more different conductive elastomers allows the contact pad 110, 120 to implement different types of connections, such as a simple interconnect, connections to a resistor, to a capacitor, to a combination of a resistor and a capacitor, to an insulator or to one or more other passive components.

In various circuit implementations, a pull-up or pull-down resistor is connected to an input pin of an electronic device to configure an operation mode of the electronic device. In other circuit configurations, such as a serial termination resistor is inserted into a signal path next to an output driver of an electronic device to reduce ringing noise by modifying the impedance of a signal trace coupled to the electronic device. In additional circuit implementations, an external resistor is coupled to a driver of an electronic device to regulate the driver's current output. For example, an external resistor is used to control the current output from a programmable input/output (PIO) pin of an electronic device to control the brightness of a light emitting diode (LED).

Figure 2:
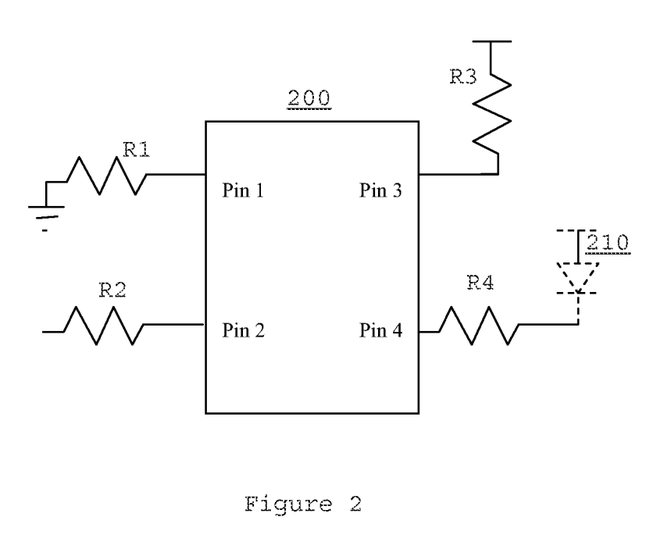
FIG. 2 illustrates example connections of resistors to an electronic component.

FIG. 2 illustrates example connections of resistors to an electronic device 200. For purposes of illustration, FIG. 2 illustrates an electronic device 200 having four pins, with a resistor coupled to each pin. In the example of FIG. 2, resistor R1 is used as a mode select resistor to couple a first pin of the electronic device 200 to ground, which determines whether the electronic device 200 operates in a normal mode or in a test mode. Resistor R2 is used as a signal termination resistor coupled to a second pin of the electronic device 200. Resistor R3 operates as a pull-up resistor coupled to pin 3 of the electronic device 200 and to a voltage source, for example, to disable an active-low write protect function for the electronic device 200. Also shown in FIG. 2, resistor R4 is coupled to pin 4 of the electronic device 200 as a current limiting resistor controlling the current flowing to a light emitting diode (LED) 210.

In the configurations shown by FIG. 2, resistor R1 and resistor R3 generally have a high resistance, such as in the order of 10 kΩ. The resistance of resistor R4 varies from several hundred ohms to one thousand ohms to control the brightness of LED 210. Because resistor R2 is used as a signal termination resistor, a more precise resistance around tens of ohms is typical.

In one embodiment, the resistors R1, R2, R3, R4 shown in FIG. 2 are implemented by coupling one or more conductive elastomers having different resistances to each contact pad of the electronic device 200. Coupling a conductive elastomer of different resistance to a contact pad allows the contact pad to function as an electrical connection with a passive component embedded at the contact pad. To implement different resistors for different applications, the resistance of the conductive elastomer coupled to the pad is varied. The conductive elastomer enables coupling of a resistor to a contact pad without the need to solder a separate external resistor on PCB or target platform to couple the functionality of a pin in the electronic device 200, conserving area on a PCB or target platform including the electronic device 200.

In various embodiments, the cross-sectional geometry of a contact pad coupled to one or more conductive elastomers is fabricated in a shape, such as a cylindrical cross-section, a cubic cross-section, a rhomboidal cross-section, an octagonal cross-section or any other suitable cross-sectional geometry. To modify the resistance of a conductive elastomer coupled to a contact pad, the resistivity or the cross-sectional area of conductive elastomer is varied. For example, if a conductive elastomer has uniform cross section area A and resistivity ρ, then the resistance R of conductive elastomer is shown as $R=\rho(L/A)$, where L denotes the height or the length of conductive elastomer and A denotes its cross-sectional area. By choosing a proper resistivity ρ, a particular resistance can be fabricated for a conductive elastomer with predetermined height and cross-sectional area.

Various methods are applicable to couple conductive elastomer to a contact pad. For example, a conductive elastomer having a specific resistance can be directly applied for in-situ IC contact pad fabrication as the number of resistors needed to complement the functionalities of I/O pins in an IC device is not very many.

However, coupling conductive elastomers to the contact pads of a printed circuit board (PCB) or a system board, where a large number of resistors could be needed, then a noble approach is required, if assuming only a limited number of conductive elastomers are available for coupling resistance to contact pads. One approach is to vary the cross-section areas of conductive elastomers at different contact pads, but the cross-section area would be the same within a contact pad. Another approach is to stack multiple conductive elastomers of different resistivity at a contact pad with a height properly selected for each comprising conductive elastomer. One embodiment is to stack multiple conductive elastomers of different resistivity at a contact pad to come out a stack of conductive elastomers having a net height the same among all contact pads in a PCB or a system board and has a total resistance matching a target value required by an IC pin. For example, assuming a limited set of conductive elastomers is used for fabricating contact pads at a PCB, where one conductive elastomer has a resistivity of approximately zero ohm-cm, one has a resistivity of approximately one hundred ohm-cms, one has a resistivity of approximately one thousand ohm-cms, one has a resistivity of approximately ten thousand ohm-cms, and the last one has a resistivity large enough to act as an insulator, it is possible to selectively couple these comprising conductive elastomers at a contact pad to come out a net resistance value matching the functional requirements of I/O pins by properly choosing the height of each comprising conductive elastomer under a specific cross section.

Figure 3:
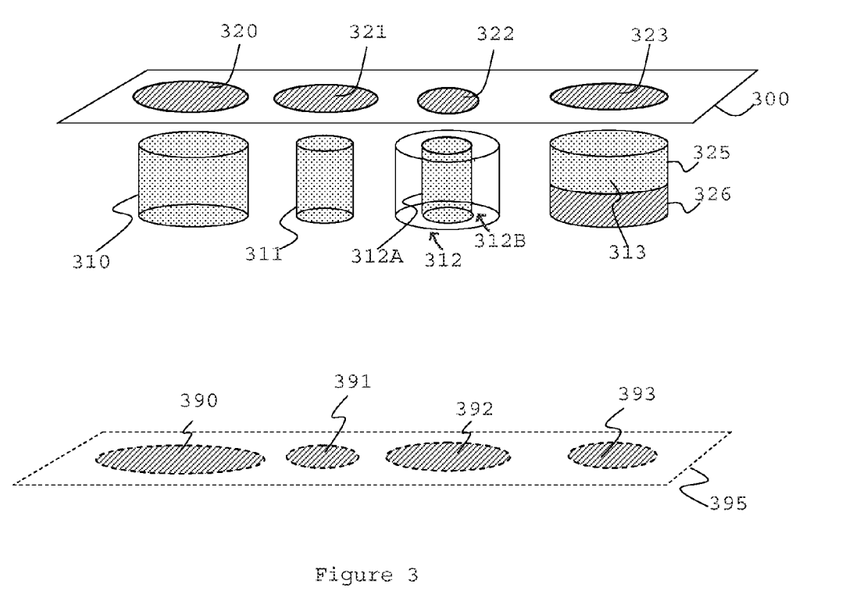
FIG. 3 is a side-view of example couplings of conductive elastomers to contact pads to implement resistors according to embodiments of the present invention.

FIG. 3 is a side-view of example couplings of conductive elastomers coupled to contact pads for implementing resistors. The example couplings of conductive elastomers depicted by FIG. 3 illustrate examples of obtaining various resistances using conductive elastomers. For purposes of illustration, FIG. 3 depicts four cylindrical contact pads 310, 311, 312, 313. The contact pads 310, 311, 312, 313 are coupled to a surface of a substrate 300 at substrate contacts, 320, 321, 322, 323, respectively. The contact pads 310, 311, 312, 313 are also coupled to target contacts 390, 391, 392, 393, respectively, on a target platform 395 of an electronic assembly. The dimensions of the substrate contacts 310, 311, 312, 313 and/or the target contacts 390, 391, 392, 393 may differ from the cross section of the contact pads 310, 311, 312, 313 so long as the size difference does not cause spurious effect. For example, the substrate contacts 320, 321, 322, 323 may have a cross-sectional area that is larger or smaller than the cross-sectional area of the contact pads 310, 311, 312, 313.

If using the cross-sectional area of contact pad 310 as a reference, reducing the cross-sectional area increases the resistance. For example, if the cross-sectional area of contact pad 311 is one-third of the cross-sectional area of contact pad 310, then the contact pad 311 would have a resistance three times of the resistance of contact pad 310, if the same conductive elastomers are used for both contact pad 310 and contact pad 311. In one embodiment, an insulating elastomer 312B is coupled to a conductive elastomer 312A to provide mechanical support without altering the resistance, as shown by contact pad 312.

In the example of FIG. 3, contact pad 313 comprises a multi-layer conductive elastomer having a resistive section 325 coupled to a conducting section 326. Coupling the resistive section 325 to the conductive section 326 lowers the height of the resistive section to reduce the resistance of contact pad 313 proportionally relative to a contact pad having a similar cross-sectional area and a full height of resistive section, such as a contact pad 310. While FIG. 3 shows the conducting section 326 coupled to a first side of the resistive section 325, in another embodiment the conducting section 326 is coupled to a second side of the resistive section 325. Alternatively, the conducting section 326 is divided into a first conducting subsection and a second conducting subsection with the first conducting subsection coupled to a first side of the resistive section 325 and the second conducting subsection coupled to a second side of the resistive section 325. The resistive section 325 may be divided into a first resistive subsection and a second resistive subsection having a different resistivity than the first resistive subsection and either the first resistive subsection or the second resistive subsection may be coupled to either the first conducting subsection or to the second conducting subsection in multiple configurations.

Figure 4:
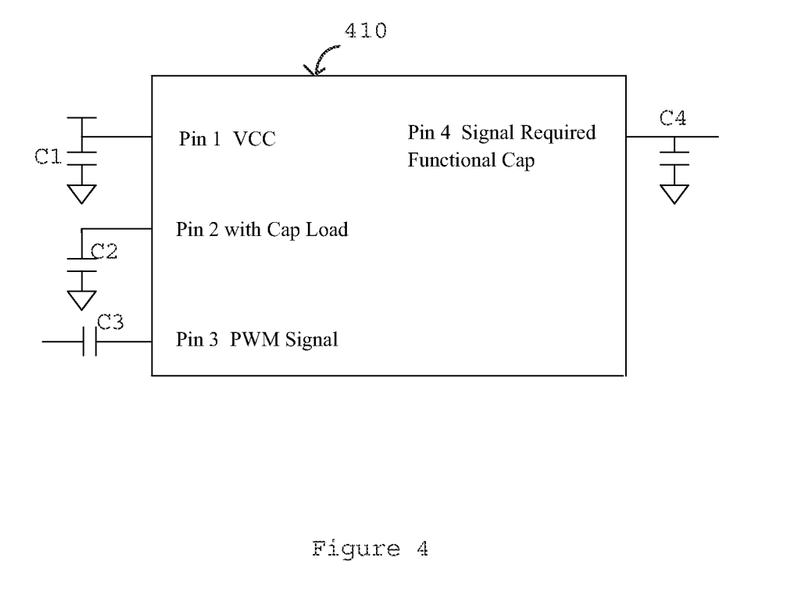
FIG. 4 illustrates example connections of capacitors to an electronic component.

In circuit implementations, a capacitor is frequently coupled to a power pin of electronic device to filter out power noise and to provide electronic charges during circuit switching. Additionally, a capacitor may be connected to a pin of electronic device for use in pin capacitance load compensation, as a coupling capacitance to an internal circuit of electronic device, as a conversion device connected to a pulse width modulation (PWM) output, or for use to block a direct current (DC) output at pin, to adjust circuit timing and/or a variety of other functions. FIG. 4 illustrates example connections of capacitors to an electronic device 410. In the example of FIG. 4, capacitor C1 operates as a decoupling capacitor coupled to pin 1 VCC of the electronic device 410 as well as to ground and a power source. Capacitor C2 is a load capacitor coupled to ground and to pin 2 of the electronic device 410. Capacitor C3 in FIG. 4 operates as a blocking capacitor coupled in series to pin 3, which is a PWM output of the electronic device 410. Capacitor C4 is coupled to pin 4 of the electronic device 410 and to ground for use in a timing adjustment capacitor, such as the one used in a PLL feedback circuit. Typically, power decoupling capacitor C1 may tolerate a higher variation in capacitance value, while other capacitors, such as C2, C3, C4 shown in FIG. 4, may require a more precise control in capacitance value, depending upon the applications for which they are used.

In one embodiment, a non-conducting elastomer or insulating elastomer coupled to a contact pad constructs an embedded capacitor at contact pad. The non-conducting elastomer coupled and sandwiched between two contact pads, where one is at substrate and the other is at target platform, creates a parallel plate capacitor. The capacitance C of a parallel plate capacitor with a uniform insulating dielectric material is shown as $\in A/D$, where $\in$ is the dielectric constant of insulating conductive elastomer, A is the area of parallel plates and D is the distance between two parallel plates. Inserting an insulating elastomer or insulating material between two parallel plates raises the dielectric constant between them to increase the capacitance of a parallel plate capacitance.

Figure 5:
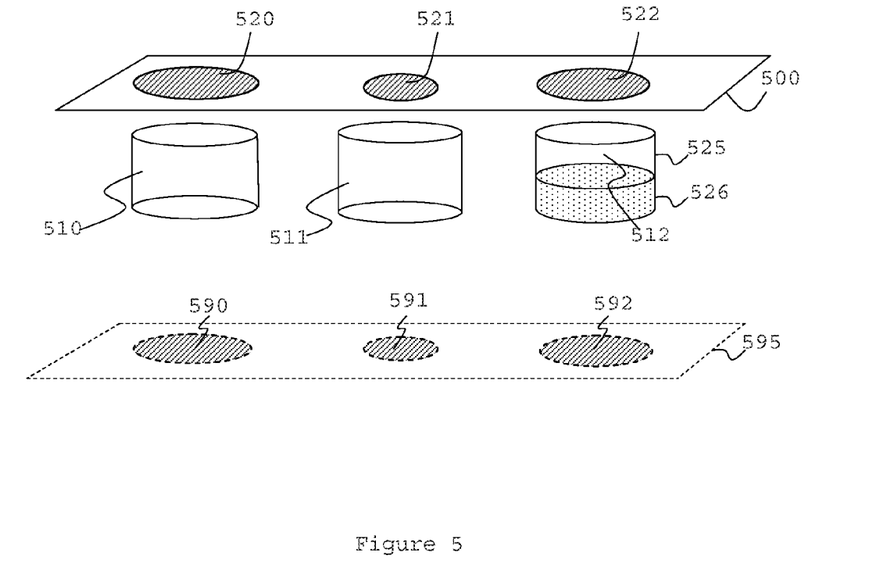
FIG. 5 is a side-view of example couplings of conductive elastomers to contact pads to implement capacitors according to embodiments of the present invention.

FIG. 5 is a set of side-view examples of fabricating embedded capacitor at contact pads. Three embedded capacitors 510, 511, 512 shown in FIG. 5 have a first surface coupled to a substrate 500 at substrate contacts or pad contacts 520, 521, 522 respectively and a second surface coupled to target contacts 590, 591, and 592 on a target platform 595 respectively.

Similar to the resistance embedded at a contact pad described above in conjunction with FIGS. 2 and 3, the capacitance embedded at a contact pad 510, 511, 512 may be modified. For example, enlarging or reducing surface area of a substrate contact 520, 521, 522 and/or surface area of a target contact 590, 591, 592 could adjust the capacitance embedded at a contact pad 510, 511, 512, even though the physical dimension of contact pad 510, 511, 512 is kept unchanged. Unlike the resistance embedded at contact pads 310, 311, 312, 313 described above in conjunction with FIG. 3, enlarging the cross section area of contact pad 510, 511, 512 has little impact on changing the value of embedded capacitance if the surface area of substrate contact 520, 521, 522 and/or the surface area of target contact 590, 591, 592 are kept unchanged.

In one embodiment, the capacitance of a contact pad 512 is increased by reducing the height of insulating elastomer. As shown in FIG. 5, a contact pad 512 comprises an insulating section 525 coupled to a conducting section 526. To maintain a uniform height for contact pad 512, the reduction in height of insulating layer 525 is allocated to that of conducting layer 526 accordingly. In an alternative embodiment, the conducting section 526 is divided into a first subsection and a second subsection where the first subsection is coupled to a first surface of the insulating section 525 and the second subsection is coupled to a second surface of the insulating section 525, so that the insulating section 525 is positioned between two conducting subsections. By coupling an insulating section 525 to a conducting section 526, the capacitance of the contact pad 512 is adjustable while the height of contact pad still remains constant.

In an embodiment where a small capacitance is required, a small embedded capacitor is constructed by having a substrate contact 520 directly coupled to a target contact 590 but without insulating material in between. Or an insulating material can be applied to surround or beyond the pad contact 520 and/or the target contact 590 simply as a mechanical support. In summary, the dimension of comprising insulating elastomer is changeable with negligible impact on the precision of capacitance embedded at contact pad 510, 511, 512, if the cross-sectional area of insulating elastomer is large enough to cover the area of pad contact or substrate contact 520, 521, 522 and the area of target contact 590, 591, 592 to which the contact pad 510, 511, 512 is attached. By altering the area of substrate contact 520, 521, 522, the area of target contact 590, 591, 592, and/or the thickness of insulating layer between the substrate contact 520, 521, 522 and the target contact 590,591,592, the capacitance of a contact pad is modified.

Figure 6:
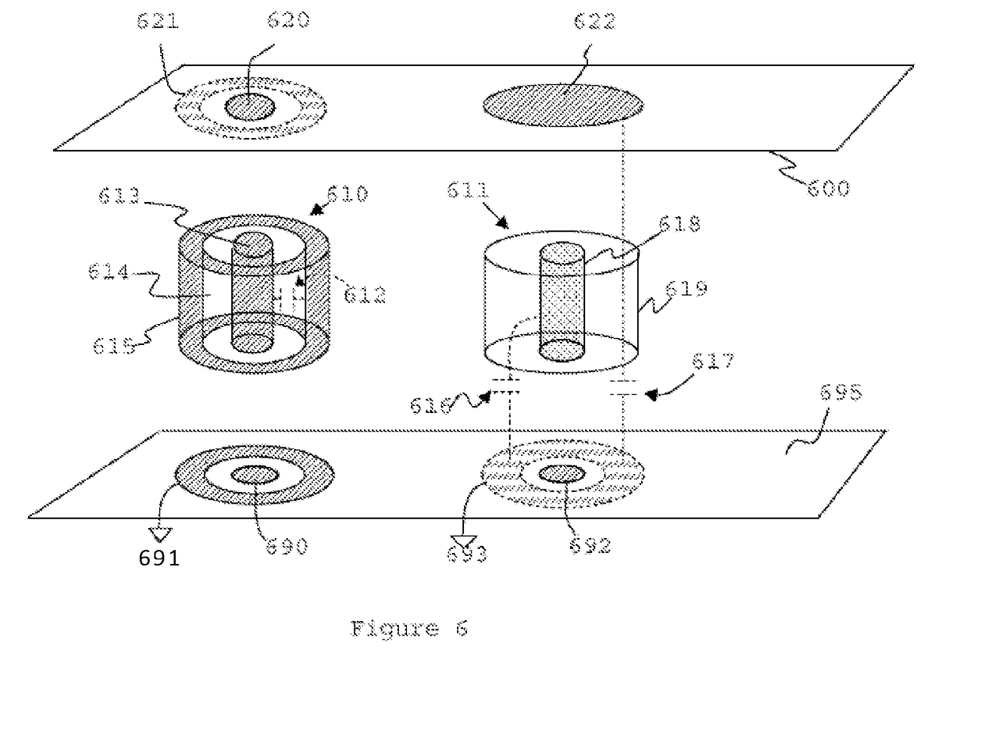
FIG. 6 illustrates cross-sectional views of examples of combinations of passive components implemented by coupling conductive elastomers to contact pads of a substrate according to embodiments of the present invention.

FIG. 6 illustrates cross-sectional views of examples of combinations of passive components implemented by coupling multiple conductive elastomers, or "combo elastomers", to contact pads of a substrate. The "combo elastomers" permit construction of a contact pad including an embedded capacitor as well as an embedded electrical conduction path connecting a target contact to pad contact. In the examples shown by FIG. 6, some contact pads have a similar structure to the contact pads including embedded resistors shown in FIG. 3. However, the use of multiple elastomers each having different resistivity and different connections at substrate contacts and target contacts when constructing the contact pads causes the combo elastomer to provide different functionalities. Additionally, the examples shown in FIG. 6 are examples of contact pads having a split pad design.

In FIG. 6, two example structures of combo elastomers 610, 611 are illustrated. For purposes of illustration, the example combo elastomers 610, 611 have a cylindrical structure, although in other embodiments the combo elastomers 610, 611 may have different structures, such as having a cross section of triangular, square, rectangular, rhomboidal, hexagonal, octagonal or other shape. Additionally, in various embodiments the combo elastomers 610, 611 have different profiles, such as a square profile, a rectangular profile, a trapezoidal profile, a thin flat plate or any other suitable profile.

The combo elastomer 610 comprises a conductive core 613, a conducting circular ring 615, and an insulating elastomer layer 614 sandwiched between the conductive core 613 and the conducting circular ring 615. In an alternate embodiment, an additional layer of insulating elastomer is affixed to the outer sidewall of the conducting circular ring 615, provided that the additional layer of insulating elastomer does not cause spurious capacitance. In one embodiment, the insulating elastomer affixed to the outer sidewall of the conducting circular ring protects the conducting circular ring 615. The combo elastomer 611, comprises a conductive core 618 and an insulating elastomer 619 substantially surrounding the outer sidewall of conducting core 618.

For applying combo elastomer 610, a target contact pad comprising an inner conducting contact 690 and a surrounding circular conducting contact ring 691 with an insulation gap in between is included in a target platform 695. The inner conducting contact 690 couples to the conductive core 613 of the combo elastomer 610 while the circular conducting contact ring 691 couples to the conducting ring 615 of the combo elastomer 610. At the surface of substrate 600, there is a substrate contact 620 coupling to the conductive core 613 of combo elastomer 610. In an embodiment, at the surface of substrate 600 there is an outer conducting contact 621 circulating the substrate contact 620, for coupling to the conducting ring 615 of the combo elastomer 610 and in turn coupling to the circular contact ring 691 at the target platform 695.

In one embodiment, to construct a decoupling capacitor embedded at power pin of an electronic device, a configuration similar to combo elastomer 610 is applicable. It comprises an inner conductive core 613 for connecting an external power to a pad contact 620 of the electronic device and a grounded conductive ring 615 surrounding the inner conductive core 613 over an insulation layer 614 to implement an embedded capacitor 612 at contact pad. A small resistive or a highly conductive elastomer may be chosen for the conductive core 613, depending upon the requirement in power noise filtering.

Using combo elastomer 610 as a contact pad of an electronic device, the inner conductive core 613 connects a power or signal from a conducting contact 690 at a surface of target platform 695 to a pad contact (i.e. substrate contact) 620 at substrate. The conductive core 613 and the conductive ring 615 of combo elastomer 610 form two surfaces of a cylindrical capacitor 612 embedded at the contact pad, including an insulation elastomer 614 as a dielectric layer of the capacitor 612. Modifying the thickness of insulation elastomer 614 alters the capacitance of combo elastomer 610.

If conductive core 613 is composed of an elastomer material with a controlled resistivity, the combo elastomer 610 becomes a distributed resistor-capacitor (RC) circuit, which may function as a low pass filter directly embedded at contact pad. In an embodiment, a conductive pad contact ring 621 is incorporated at the surface of substrate 600 to provide an additional ground connection from target platform to substrate for the combo elastomer 610.

In an embodiment, another configuration of combo elastomer 611 is shown in FIG. 6, which couples a conductive path and an embedded capacitor to a contact pad. In the configuration, the surface of target platform 695 includes a set of target contacts, which comprises a conducting contact core 692, surrounded by an insulation gap and further surrounded by a conducting contact ring 693. The combo elastomer 611 at contact pad comprises a conductive core 618 surrounded by an insulating cylindrical elastomer 619, although in alternative configurations the conductive core 618 and the insulating cylinder 619 may have a different cross-sectional geometry. At the surface of substrate 600, a substrate contact or pad contact 622 is sized to have a cross-sectional area at least partially overlapping with the target contact ring 693 being tied to ground.

Applying combo elastomer 611 as a contact pad of an electronic device, the conductive core 618 couples the conducting target contact 692 at the surface of target platform 695 to the pad contact 622 at the surface of substrate 600 for connecting power or signal from target platform to substrate. Meanwhile, the pad contact 622 on substrate is in contact with the conductive core 618 to function as an electrode of two embedded capacitors 616, 617, which is coupled to the target contact ring 693 functioning as the opposite electrode. The insulating elastomer 619 acts as a dielectric layer. The area overlapping between the pad contact 622 and the target contact ring 693 determines the capacitance value of embedded capacitor 617. The capacitance value is adjustable by changing the size of pad contact 622 and the dimension of target contact ring 693, provided that the conductive core 618 is not in contact with the outer target contact ring 693 to short both.

In various embodiments, the thickness of combo elastomer 611 as contact pads for an IC package, PCB, or substrate, is in millimeter or sub-millimeter range. In other embodiment, such as in integrated circuit applications, the thickness of combo elastomer 611 is in thinner micrometers or sub-micrometer range.

If the conductive core 618 in combo elastomer 611 is constructed by using a resistive elastomer, a resistive core is formed. The combo elastomer 611 then functions as a resistor connected to a contact pad with companion capacitors 616, 617 embedded at the contact pad. Thus, depending on the configuration of substrate contacts and target contacts in an electronic assembly and the conducting properties of elastomer material comprising a combo elastomer, the combo elastomer may function as an embedded resistor, an embedded capacitor, a substrate mechanical support or as other desirable functions.

Figure 7:
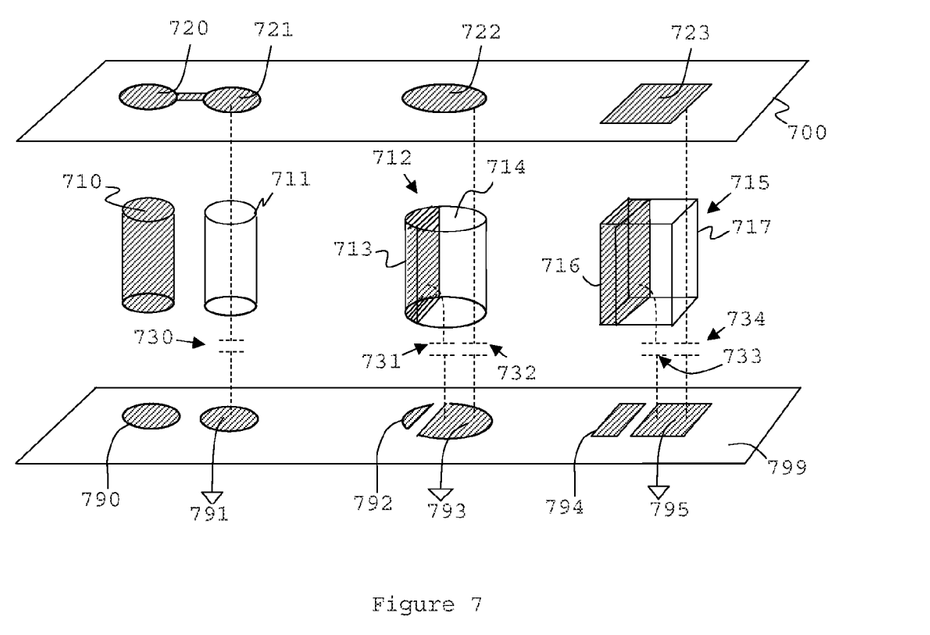
FIG. 7 illustrates cross-sectional views of additional example combinations of passive components implemented by coupling conductive elastomers to contact pads of a substrate according to embodiments of the present invention.

FIG. 7 illustrates cross-sectional views of additional example combo elastomers. One embodiment is the coupling of elastomers from a plurality of contact pads form a different type of combo elastomer. For example, in FIG. 7 two elastomers at two contact pads are coupled to form a combo elastomer, where a first elastomer 710, such as a conducting elastomer, is coupled to a second elastomer 711, such as an insulating elastomer, by connecting their respective pad contacts or substrate contacts 720 and 721 together. Connecting the respective pad contacts can take place at the surface of substrate or through an inner layer of substrate. In dual pad configuration, the first elastomer 710 couples a first target contact 790 at the surface of target platform 799 to a first pad contact 720 at the surface of substrate 700 to connect signal or power from target platform to substrate. The second elastomer 711 couples a second target contact 791, which is grounded at the surface of target platform 799, to a second pad contact 721 at the surface of substrate 700 to form a capacitor embedded at pad contact 721. Connecting pad contacts 720 and 721 at the surface of substrate 700 forms a combo elastomer that enables the connection of power or signal from target platform to substrate with an embedded capacitor connected to contact pad.

In alternative configurations, FIG. 7 shows two other example combo elastomers 712, 715 formed by having two different elastomers butted within a single contact pad. The combo elastomer 712 comprises a first elastomer 713, such as a conducting elastomer, and a second elastomer 714, such as an insulating elastomer, each in a column structure, such as a half cylindrical column, a rectangular column or in column of other geometric shape. In one embodiment, split contacts are applied to combo elastomer 712, 715, either at the surface of substrate 700 or at the surface of target platform 799. Signal or power could be transferred by using a smaller half of combo elastomer 712,715, such as the conducting elastomer 713, 716, while the embedded capacitor could use a larger half of combo elastomer, such as the insulating elastomer 714, 717 shown in FIG. 7. The pad contact or target contact could be asymmetrical and comprises two unequal contact sizes at a single contact pad.

As shown in the examples of FIG. 7, target contacts at the surface of target platform 799 comprise a first contact region 792, 794 coupled to the first conducting elastomer 713, 716 and a second contact region 793, 795 coupled to the second elastomer 714, 717 for combo elastomer 712, 715. Additionally, the example combo elastomers 712, 715 are coupled to a pad contact 722, 723 included at the surface of substrate 700. In another embodiment, the pad contact included at the surface of substrate 700 comprises a first contact region and a second contact region.

Figure 8:
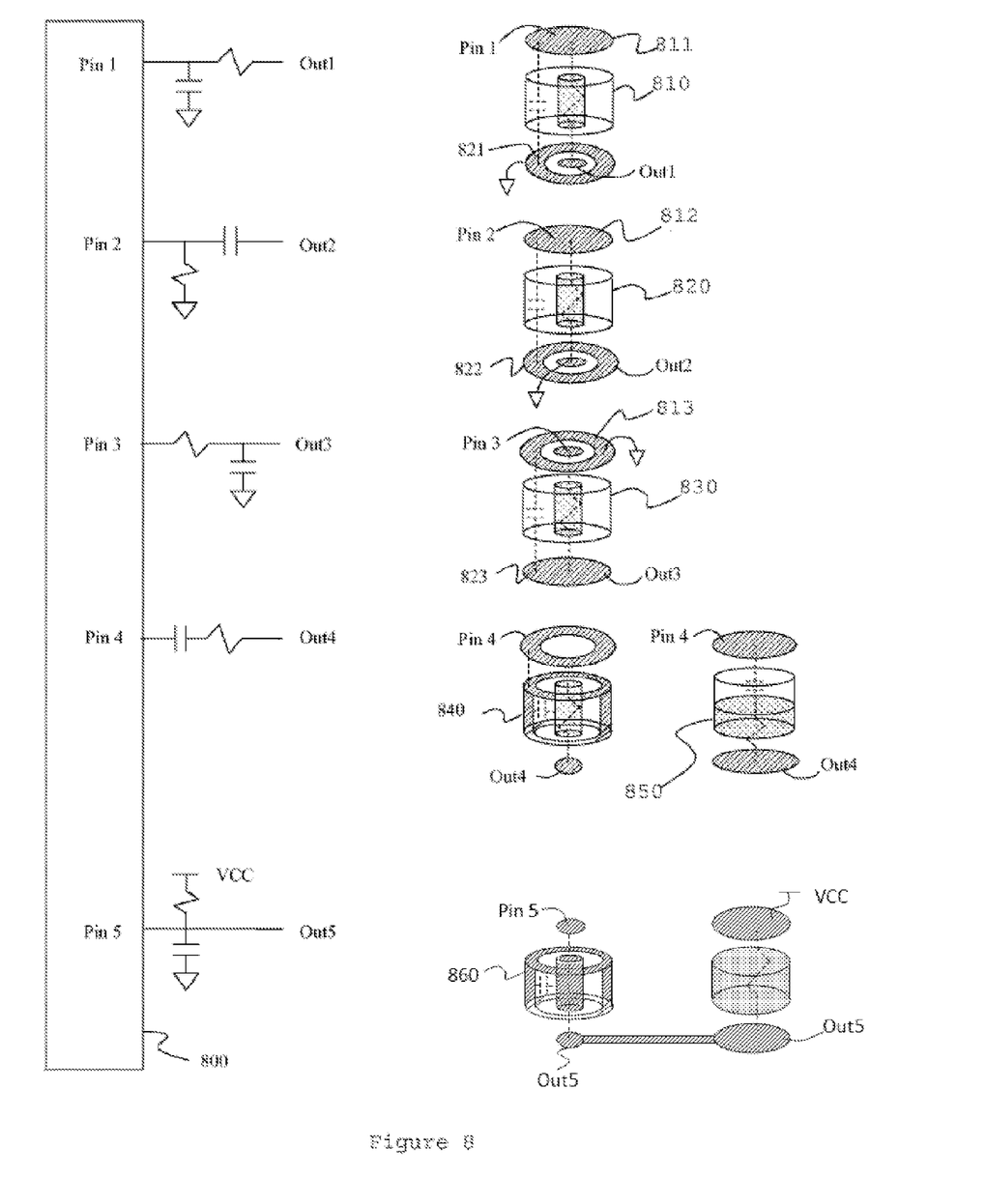
FIG. 8 shows cross-sectional views of various combinations of resistors and capacitors implemented by coupling conductive elastomers to contact pads of a substrate according to embodiments of the present invention.

Many digital designs include circuits having a combination of a resistor and a capacitor (an "RC circuit"). FIG. 8 shows examples of RC circuits connected to pins 1-5 of an example integrated circuit (IC) 800. An RC circuit can be embedded at a contact pad of IC 800 with proper coupling of one or more conductive elastomers at respective pin.

In the example RC circuits depicted by FIG. 8, an RC circuit coupled to pin 1, 2 or 3 of the IC 800 is implemented by a combo elastomer comprising a resistive conducting elastomer core surrounded by an insulating elastomer. By varying the configuration and signal connection of the pad contacts 811, 812, 813 at a substrate and/or by varying the configuration and signal connection of the target contacts 821, 822, 823 at a target platform, different RC circuits, such as the RC circuits connected to pins 1, 2 and 3 of IC 800, can be implemented by using a similar combo elastomer that has a resistive conducting elastomer surrounded by an insulating elastomer. The pin connection, output signal, ground connection and the structure of combo elastomer for the embedded RC circuits coupled to pins 1, 2 and 3 in FIG. 8 are shown for purposes of illustrations.

FIG. 8 also shows examples of additional RC circuits coupled to pins 4 and 5 of the IC 800, whose combo elastomer has a different structure than the combo elastomer used in the implementation of RC circuits coupled to pins 1, 2 and 3. For example, the RC circuit embedded in combo elastomer 840 coupled to pin 4 of the IC 800 comprises a resistive core, surrounded by an insulating elastomer, which is further surrounded by an outer conduction elastomer. Additionally, the pad contact and the target contact coupled to the combo elastomer 840 differ in contact size, with the pad contact being the pin 4 of IC 800 and the target contact being the RC circuit output connected to target platform. Combo elastomer 850 shown in FIG. 8 is an alternative implementation of same RC circuit coupled to pin 4 of IC 800, where pad contact and target contact are similar in the contact size. The RC circuit coupled to pin 4 could be used in a pulse width modulation (PWM) or loop filter circuit, and so on.

The combo elastomer 860 in FIG. 8 depicts an example implementation of another RC circuit coupled to pin 5 of IC 800. It includes an additional power connection to a RC circuit. In one embodiment, combo elastomer 860 is formed by linking elastomers at two contact pads, where one pad contact at the surface of substrate functions as pin 5 of IC 800 and the other functions as a VCC connection; furthermore, two target contacts connected at the surface of target platform function as the RC circuit output through the combo elastomer 860. Thus, using conductive elastomers with controlled resistivity and structuring conductive elastomers in various geometries allow passive components and their combinations being embedded at a contact pad.

Using elastomer with passive components embedded at contact pad, as described above, is a valuable approach to solve problems encountered in traditional electronic product assembly. Traditional electronic product assembly requires to surface mount a large number of passive components on PCB, which tends to extend the size of PCB in order to accommodate the supportive passives in an electronic assembly. Many of these passive components are decoupling capacitors, compensation capacitors, termination resistors and/or current limiting resistors. By using conductive elastomers with controlled resistivity and structure, many of the passive components can be directly embedded at the contact pads of an integrated circuit (IC) during the contact pad fabrication. Thus, the surface area used by discrete passive components on a PCB or target platform could be substantially reduced. It also eliminates the placement step of passive components in conventional electronic assembly, which is a timely process especially if the quantity of passive components to be placed is huge.

Furthermore, embedding passive components at the contact pads of an integrated circuit (IC) device, the excessive routing traces on PCB for connecting external discrete passives to pins are eliminated to lower the spurious signal noises and interferences for a more robust performance of an electronic system.

Additionally, after components are soldered on a PCB or target platform, to de-solder a defective IC and to replace a new component at rework is also a challenging task, especially if the pin pitch and the pad size of component is small. The difficulty in removing the components from an electronic assembly and the risk of damaging a component during component removal limit the reuse of components within the electronic assembly or system. A cold assembly process, such as the use of conductive elastomers described above, simplifies manufacturing process and favors component reuse to lower product cost and to reduce electronic wastes which is highly desirable for green environments. Embedding passive components in contact pads using conductive elastomers could cut down the use of trillions discrete passive components annually and simplify material management. Using elastomer as contact pad material for electronic device would make a solderless electronic assembly feasible as conductive elastomer could make a good contact with target contacts on a PCB or target platform.

For surface mount technology, there is an emerging challenge to solder ultra-small passives with enough soldering but without suffering solder bridging in an electronic assembly. Embedding passive components at contact pad mitigates the difficulty of soldering ultra-small passive components to an electronic assembly. As portable electronic products become more popular, the active and passive components assembled in an electronic product become smaller and smaller. For example, a 0603 package size having a dimension of 60 mils in length and 30 mils in width was commonly used for passive components. The 0603 package size was subsequently replaced by a smaller 0402 package size having a dimension of 40 mils in length and 20 mils in width, which was supplanted by a 0201 package having a dimension of 20 mils in length by 10 mils in width. Currently, the smallest package used for passive components is a 01005 package having a dimension of 10 mils in length by 5 mils in width. Because of their small size, soldering passive components constructed using these packages to a PCB without a solder bridging problem or using insufficient solder is extremely difficult. Because of their small size it is also common for passives to fall off of an electronic assembly during the shipping and handling or field use. Using a pad construction with a needed passive component embedded in a contact pad using one or more conductive elastomers would allow use of a solderless assembly better suited for fine pitch assembly of electronic devices.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. An electronic device for coupling to a target platform, the target platform including a plurality of pad contacts, the electronic device comprising:
   a substrate;
   a plurality of pad contacts on the substrate, each of the plurality of pad contacts on the substrate electrically coupling to a corresponding one of the plurality of pad contacts on the target platform when the substrate and the target platform are assembled; and
   a plurality of contact regions in one of the plurality of pad contacts on the substrate wherein the plurality of contact regions corresponds to one of the plurality of pad contacts on the target platform when the substrate and the target platform are assembled.

2. The electronic device of claim 1, wherein one of the plurality of contact regions is coupled to ground.

3. The electronic device of claim 1, wherein one of the plurality of contact regions is coupled to power.

4. The electronic device of claim 1, wherein the plurality of contact regions includes:
   a first contact region coupled to a signal; and
   a second contact region coupled to ground.

5. The electronic device of claim 1, wherein the plurality of contact regions includes:
   a first contact region coupled to a signal; and
   a second contact region coupled to power.

6. The electronic device of claim 1, wherein the plurality of contact regions includes:
   a first contact region being an insulator; and
   a second contact region being a conductor adapted to enclose the first contact region.

7. The electronic device of claim 1, wherein the plurality of contact regions includes:
   a first contact region being a conductor;
   a second contact region being an insulator adapted to enclose the first contact region; and
   a third contact region being a conductor adapted to enclose the second contact region wherein the second contact region is adapted to electrically isolate the first contact region from the third contact region.

8. The electronic device of claim 1, wherein the plurality of contact regions includes:
   a first contact region being a conductor;
   a second contact region being an insulator adjacent the first contact region; and
   a third contact region being a conductor adjacent the second contact region wherein the second contact region is between the first and third contact regions and is adapted to electrically isolate the first contact region from the third contact region.

9. The electronic device of claim 1, wherein the substrate is a bare die integrated circuit, a stacked die integrated circuit, a packaged integrated circuit, a packaged component, a flex circuit, a rigid flex circuit, or a printed circuit board.

10. A method for assembling an electronic device to a target platform, the target platform including a plurality of pad contacts, the method comprising:
   providing a substrate on the electronic device;
   providing a plurality of pad contacts on the substrate, each of the plurality of pad contacts on the substrate electrically coupling to a corresponding one of the plurality of pad contacts on the target platform when the substrate and the target platform are assembled; and
   providing a plurality of contact regions in one of the plurality of pad contacts on the substrate wherein the plurality of contact regions corresponds to one of the plurality of pad contacts on the target platform when the substrate and the target platform are assembled.

11. The method of claim 10 including coupling one of the plurality of contact regions to ground.

12. The method of claim 10 including coupling one of the plurality of contact regions to power.

13. The method of claim 10 including:
providing a first contact region and a second contact region in the plurality of contact regions;
coupling the first contact region to a signal; and
coupling the second contact region to ground.

14. The method of claim 10 including:
providing a first contact region and a second contact region in the plurality of contact regions;
coupling the first contact region to a signal; and
coupling the second contact region to power.

15. The method of claim 10 including:
providing a first contact region and a second contact region in the plurality of contact regions; and
enclosing the first contact region by the second contact region wherein the first contact region is an insulator and the second contact region is a conductor.

16. The method of claim 10 including:
providing a first contact region, a second contact region, and a third contact region in the plurality of contact regions;
enclosing the first contact region by the second contact region; and
enclosing the second contact region by the third contact region to electrically isolate the first contact region from the third contact region wherein the first and third contact regions are conductors and the second contact region is an insulator.

17. The method of claim 10 including:
providing a first contact region, a second contact region, and a third contact region in the plurality of contact regions; and
electrically isolating the first contact region from the third contact region by the second contact region wherein the first and third contact regions are conductors and the second contact region is an insulator.

18. The method of claim 10, wherein the substrate is a bare die integrated circuit, a stacked die integrated circuit, a packaged integrated circuit, a packaged component, a flex circuit, a rigid flex circuit, or a printed circuit board.

* * * * *